(12) United States Patent
Cochrane

(10) Patent No.: US 7,417,502 B1
(45) Date of Patent: Aug. 26, 2008

(54) SELECTABLE POWER SUPPLY FOR AUDIO AMPLIFIER

(76) Inventor: Paul Cochrane, 2431 Sawwell St., Murfreesboro, TN (US) 37128

( * ) Notice: Subject to any disclaimer, the term of this patent is extended or adjusted under 35 U.S.C. 154(b) by 110 days.

(21) Appl. No.: 11/335,438

(22) Filed: Jan. 18, 2006

(51) Int. Cl.
*H03G 3/00* (2006.01)

(52) U.S. Cl. .................................. 330/127; 330/297

(58) Field of Classification Search ................ 330/127, 330/297, 140; 363/67, 114, 125, 126
See application file for complete search history.

(56) References Cited

U.S. PATENT DOCUMENTS

| | | |
|---|---|---|
| 836,531 A | 11/1906 | Pickard |
| 1,822,811 A | 9/1931 | Hubbard |
| 1,845,151 A | 2/1932 | Hubbard |
| 1,867,667 A | 7/1932 | Hubbard |
| 1,961,153 A | 6/1934 | Lazarus |
| 1,970,889 A | 8/1934 | Heyer |
| 2,172,156 A | 9/1939 | Amsden |
| 2,286,499 A | 6/1942 | Mittelmann |
| 2,402,661 A | 6/1946 | Ohl |
| 2,642,558 A | 6/1953 | Terry et al. |
| 2,777,107 A | 1/1957 | Medlar |
| 3,205,426 A | 9/1965 | Mills |
| 3,663,828 A | 5/1972 | Low et al. ............... 307/83 |
| 5,091,700 A | 2/1992 | Smith ...................... 330/128 |
| 5,168,438 A | 12/1992 | Smith ...................... 363/67 |
| 5,612,646 A * | 3/1997 | Berning ................... 330/297 |
| 5,767,744 A * | 6/1998 | Irwin et al. .............. 330/297 |
| 6,956,749 B2 * | 10/2005 | Yasumura ................ 363/19 |

OTHER PUBLICATIONS

Fender Musical Instruments, 1 page of Prosonic amplifier schematic, Dec. 1995.
David Szabados, Metropoulos Amplification '68 12000 Series Plexi 100 Watt Amplifier Head, date unknown, 6 pages.
Author Unknown, VHT Amplification—Pitbull Model G-50-CL Functions (Manual), date unknown, 4 pages.
Author Unknown, Civil Docket For case #: 5:07-cv-04302-RS, Case filed Aug. 21, 2007, 3 pages.
William Sloan Coats, Complaint Of Plaintiff Mesa/Boogie, Ltd. For Patent Infringement, dated Aug. 21, 2007, 6 pages.
Daniel P. Muino, Defendant's Answer To Complaint, dated Oct. 16, 2007, 5 pages.
Author Unknown, Civil Docket For case #: 5:08-cv-00209-JF, Case filed Jan. 11, 2008, 3 pages.
Jennifer M. Lantz, Defendant Bad Amplifier Co., Inc's Answer To Complaint For Patent Infringement, dated Mar. 5, 2008, 4 pages.
Author Unknown, Bad Cat Hot Cat 30 Schematic, Feb. 11, 2005, 1 page.

* cited by examiner

*Primary Examiner*—Khanh V Nguyen
(74) *Attorney, Agent, or Firm*—The Patent Source

(57) ABSTRACT

The disclosure is directed to power supplies for audio amplifiers that focus on the importance of certain power supply characteristics in forming the overall qualities of a tube amplifier. The power supplies may use a power transformer with two dissimilar and selectable secondary windings to supply the voltages for a single vacuum tube power amplifier (B+ voltages). The power supplies may also apply different rectifier characteristics to complement the use of multiple differing secondary windings. The power supplies may also use different capacitor bank options to filter ripple voltage. The power supplies may also use of coordinated grid-bias voltage adjustment that coincides with secondary winding selection. The power supplies may also use coordinated preamp bias voltage adjustment that coincides with secondary winding selection.

17 Claims, 3 Drawing Sheets

| | S2A | S2B | S2C | S2D |
|---|---|---|---|---|
| PUNCH | WB | CLOSED | CLOSED | OPEN |
| SAG | WA | OPEN | OPEN | CLOSED |

Figure 1a

| | S2A' | S2C | S2D |
|---|---|---|---|
| PUNCH | RB | CLOSED | OPEN |
| SAG | RA | OPEN | CLOSED |

Figure 2a

SELECTABLE POWER SUPPLY FOR AUDIO AMPLIFIER

BACKGROUND OF THE INVENTION

1. Field of the Invention

The present invention is directed to systems, processes and apparatus for selecting from between multiple power supplies for use with audio amplifiers. More particularly, the invention relates to the field of electronic musical instrument amplifiers that enable selection from between multiple power supplies to achieve differing sonic effects. Accordingly, the general objects of the invention are to provide novel systems, methods and apparatus of such character.

2. Description of the Related Art

The development of audio amplifiers from the early days of electronics has tracked the development in electronics components in many ways. For example, audio amplifiers, which originally used vacuum tubes as amplifying and rectifying elements, widely migrated to semiconductor elements soon after such elements became available. Nonetheless, the use of vacuum tubes persists in several niche applications such as hi-fi stereos, instrument amplification, recording pre-amplifiers, etc. due to a continuing and widespread belief that vacuum tubes produce superior results in such applications.

In the field of musical instrument amplifiers, certain "vintage" instrument amplifiers are much sought after for their ability to provide the sonic qualities of various well known and appreciated musical styles. Unfortunately, such vintage amplifiers typically have deteriorated with age and have become unreliable to the extent that use of such vintage devices is unacceptable. Even in those instances where the performance is satisfactory when measured against the original specifications for the equipment, musicians frequently find that such equipment is extremely limited by today's standards of versatility. There has, therefore, been a need for equipment capable of producing a range of tones of quality vintage equipment while at the same time providing the versatility and reliability more commonly associated with modern equipment. In order to meet this long standing and accelerating demand, vacuum tube amplification continues to progress around the periphery of a handful of basic designs in an effort to provide more economical, reliable, versatile and user-friendly amplifiers that offer musicians a choice of familiar sonic qualities.

Among the areas that have been the subject of such development has been preamp switching design, amplifier switching design, digital amplifier modeling technology, and power tube substitution schemes for vacuum tube guitar amplifiers. However, the sonic contribution of power supply design has only recently come under scrutiny among musicians and amplifier designers. In particular, the sonic contributions of such factors as, preamp bias voltage, power amp bias voltage, type of power amp biasing, the effects of various component types and sizes are being explored more closely.

This renewed interest in power supply design has yielded some efforts to provide more versatile power supplies to achieve varying musical effects. One such effort is described in U.S. Pat. No. 5,168,438, entitled Selectable Dual Rectifier Power Supply For Musical Amplifier, which describes a simple switching method for selecting from between either a solid-state rectifier or a vacuum thermionic rectifier within a single power supply. This approach offers a reasonably economical way of approximating the desirable characteristics of tube-based rectifiers with the desirable characteristics of solid-state rectifiers in a single amplifier. Unfortunately, this design trades certain subtle sonic qualities in favor of economy and simplicity in its approximation of both styles of power supplies. For example, since this design uses the same secondary power transformer coil and the same ripple-voltage filter regardless of the type of rectification selected only a limited range of changes are possible.

Another effort of this general type is disclosed in U.S. Pat. No. 5,091,700 and entitled Amplifier With Mains Voltage Reduction. This patent describes the use of a switch to adjust the mains voltage such that it is possible to reduce the voltages in an amplifier for a different musical effect. This switch adjusts the mains input voltage by selecting a primary winding tap on the primary side of a power transformer to thereby change all the voltages in the amplifier. While this design does appreciate that some transformer characteristics are important in creating the overall amplifier characteristics, its simplistic approach is incapable of changing a limited set of voltages while leaving others unaffected (or changed in the opposite direction). Thus, once again, this design offers economy and simplicity at the expense of some of the finer elements of the several vintage amplifiers it tries to approximate. For example, this design also uses the same secondary power transformer coil and the same ripple-voltage filter regardless of the type of rectification selected.

Yet another effort to offer a more versatile amplifier power supply for a vacuum tube amplifier is embodied in an amplifier known as the FENDER® PROSONIC®. This amplifier uses a switching system slightly more complicated than those noted above to offer a number a rectification options. Once again, however, this design also uses the same power transformer and the same ripple-voltage filter regardless of the rectification circuit selected. It, thus, also fails to appreciate the important role of transformer design in the overall amplifier characteristics.

All of the designs noted above suffer from the deficiency that they all sacrifice some degree of sound quality in an effort to provide approximations of the sonic qualities of multiple amplifiers. Thus, after many years, no amplifier design has been able to faithfully emulate the essential characteristics of several different vintage amplifiers in one simple, economical, reliable and user-friendly amplifier.

There is, accordingly, a need in the art for novel methods, systems and apparatus that faithfully emulate the desired characteristics of several vintage amplifiers in one simple, economical, reliable and user-friendly package. Such methods and apparatus should go further than prior efforts in capturing various subtle qualities of various amplifier designs without presenting users with undue additional complexity, weight size and/or expense.

SUMMARY OF THE INVENTION

The present invention satisfies the above-stated needs and overcomes the above-stated and other deficiencies of the related art by providing methods, systems and apparatus offering improved power supply options for vacuum tube audio amplifiers. The power supplies of the present invention offer better emulation of disparate vintage amplifier tonality while also maintaining a high degree of economy, reliability and simplicity.

One aspect of the present invention is directed to an improved power supply for vacuum tube audio amplifiers that focuses on the importance of certain power transformer characteristics in forming the overall qualities of a tube amplifier. In this regard, the invention uses a power transformer with two dissimilar and selectable secondary windings to supply the plate voltages for a single vacuum tube power amplifier (B+ voltages). Power supplies in accordance with the invention may, or may not, also apply different rectifier characteristics to complement the use of multiple differing secondary windings and, thus, further augment the range of power supply characteristics provided. Power supplies in accordance with the invention may or may not also use different capacitor bank options to filter ripple voltage in conjunction with one or both of the inventive features noted above. Yet another optional aspect of the present invention is directed to the use of coordinated power amplifier grid-bias voltage adjustment that coincides with the secondary winding selection noted above. Still another important optional feature of the present invention concerns the use of coordinated preamp plate voltage adjustment that coincides with the secondary winding selection noted above.

In a related form, the invention is directed to methods of selecting various power supply options for supplying vacuum tube audio amplifiers with varying characteristics. Methods in accordance with the invention may include coordinated selection of differing secondary transformer windings, differing rectifying characteristics, differing ripple-voltage filter elements, and/or differing pre-amp plate voltages.

Naturally, the above-described methods of the invention are particularly well adapted for use with the above-described apparatus of the invention. Similarly, the apparatus of the invention are well suited to perform the inventive methods described above.

Numerous other advantages and features of the present invention will become apparent to those of ordinary skill in the art from the following detailed description of the preferred embodiments, from the claims and from the accompanying drawings.

BRIEF DESCRIPTION OF THE DRAWINGS

The preferred embodiments of the present invention will be described below with reference to the accompanying drawings where like numerals represent like steps and/or structures and wherein:

FIG. 1*a* is a logic table illustrating the preferred coordinated switching of the selectable power supply of embodiment of FIG. 1;

FIG. 2*a* is a logic table illustrating the preferred coordinated switching of the selectable power supply of the embodiment of FIG. 2.

DETAILED DESCRIPTION OF THE PREFERRED EMBODIMENTS

Figure 1:
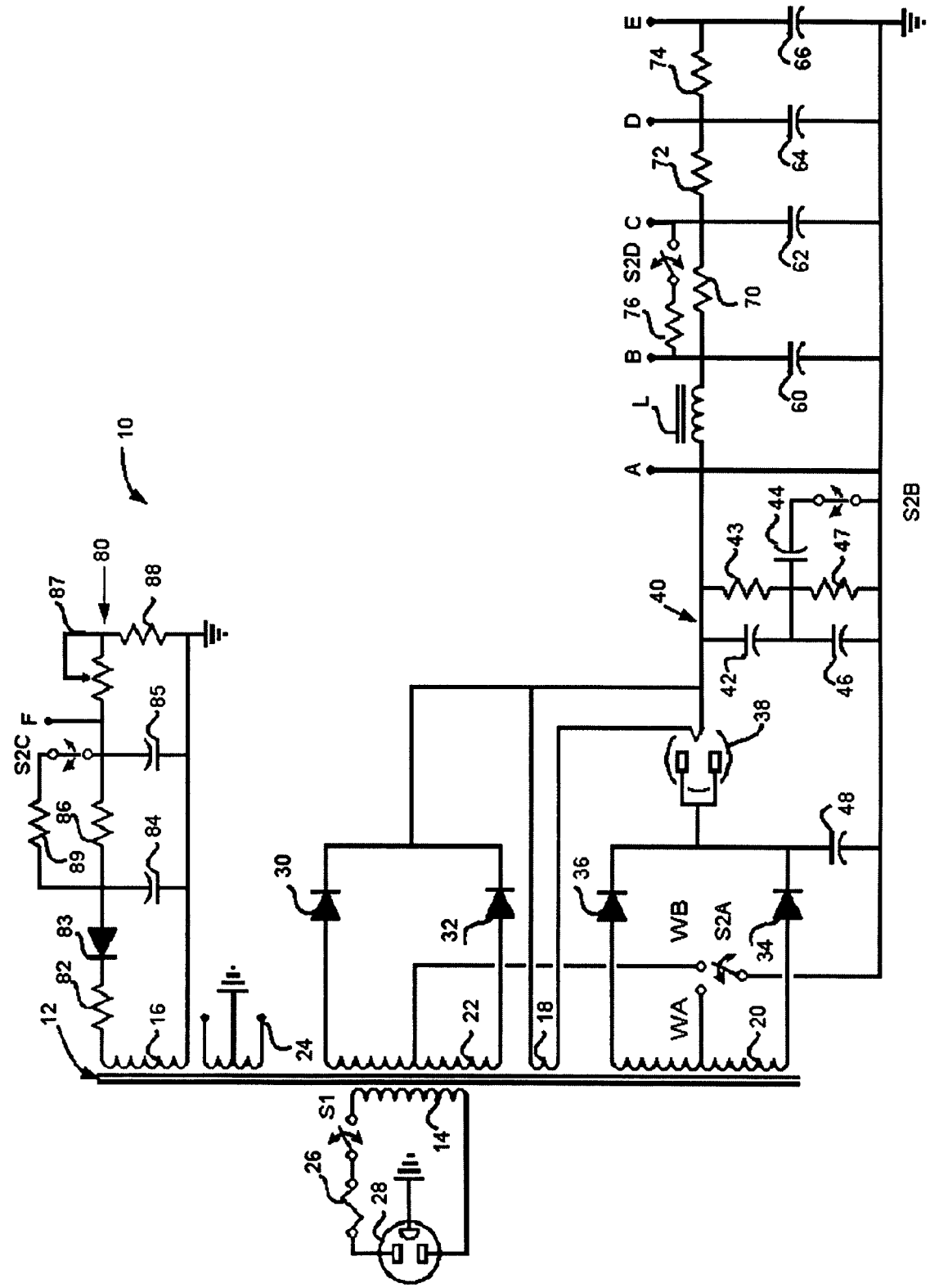
FIG. 1 is selectable power supply for use with a vacuum tube audio amplifier in accordance with one preferred embodiment of the present invention.

With joint reference to FIGS. 1 and 1*a*, an amplifier power supply 10 according to one preferred embodiment of the present invention is shown. The power supply 10 is capable of operation in, preferably, two modes: (1) referred to herein as the "punch" mode which is characterized by a relative voltage insensitivity to different current-demand conditions dictated by the connected audio amplifier; and (2) referred to herein as the "sag" mode which is characterized by a relative voltage sensitivity to different current-demand conditions dictated by the connected audio amplifier. These modes are user-selected to achieve differing sonic effects and are changed by a number of coordinated switches. The states of these switches for the embodiment of FIG. 1 are summarized in FIG. 1*a* and discussed in detail below.

As shown in FIG. 1, the inventive power supply may include a conventional connection 28 for receiving AC power, connected through a conventional fuse 26 and a power on/off switch S1 coupled to a primary winding 14 of a power transformer 12. The power transformer 12 preferably includes a plurality of secondary windings, including a 6.3 volt heater winding 24, a first high voltage secondary 22 coil with a center tap WB, a second high voltage secondary 20 coil with a center tap WA, a power amplifier negative bias winding 16 and a five volt filament winding 18. As shown, the center tap terminals WB and WA of the first and second secondary windings 22 and 20 may be selectively connected to ground via toggle switch S2A. When one of the center taps is coupled to ground in this way, the corresponding winding will pass AC power voltage to the corresponding rectifiers (30/32 or 34/36 as the case may be) and, thus, the winding has been selected.

It will be appreciated, that switch S2A may also have a third position in which it is not connected with either of WA or WB. If this third position (not shown) is provided, switch S2A serves as both a winding selector and a power supply stand-by switch. Additionally, a single-pole single-throw switch S2B selectively permits activation of additional capacitors by permitting selective connection with ground. It will also appreciated that the switch S2B is coordinated with the switch S2A such that the capacitor 44 is only electrically activated when the first secondary winding 22 is activated. In this way, capacitor 44 may be selectively disabled so that it does not interfere with use of thermionic vacuum element 38. These various features are described in greater detail below.

When the switch S1 is closed (thereby delivering power to the transformer 12) and the user selects the "punch" mode, switch S2B is closed and switch S2A is connected with terminal WB and, thus, high voltage AC from the winding 22 is applied to solid state rectifiers 30 and 32. High voltage winding 22 is specifically designed with a volt-amp rating that far exceeds the expected demand of the connected audio amplifier so that the voltage provided therefrom is relatively insensitive to the changing demands of the connected audio amplifier. Filter capacitor bank 40 reduces the ripple voltage from the rectified DC in a conventional manner and, thus, presents at point A a DC voltage adapted to supply vacuum thermionic elements of an audio amplifier. Similarly, capacitor bank 40 is specifically designed with a capacitance that exceeds the expected needs of the connected audio amplifier due to the added capacitance from capacitor 44 so that the voltage provided therefrom is relatively insensitive to the changing demands the amp. As shown, capacitor bank 40 may comprise a voltage divider formed of a pair of resisters 43 and 47 to which capacitors 42 and 46 are connected. The voltage presented at point A may be further filtered in a conventional way by the use of an inductor L and capacitor 60 to present another DC voltage at point B. Further dropping resistors 70, 72 and 74 may apply voltage to power supply points C, D and E, to which other stages of an amplifier circuit (not shown) may be connected. Further decoupling and filtering may be provided by capacitors 63, 64 and 66 in a conventional manner as shown.

With continuing attention on FIG. 1, it is noted that a user may, alternatively, select a "sag" mode. In this alternative mode, the switch S2B deactivates capacitor 44, and the switch S2A connects with terminal WA to thereby apply high voltage AC from the winding 20 to solid state rectifiers 34 and 36. Additionally, filter 48 of relatively small capacitance reduces the ripple voltage from rectifiers 34 and 36. Rectified DC is, thus, applied to vacuum thermionic element 38. High voltage winding 20 is specifically designed with a lower volt-amp rating than that of winding 22. In particular, the volt-amp rating of winding 20 is intentionally selected to cause a substantial voltage drop when the current demand of the connected audio amplifier increases substantially. In this way, the voltage provided therefrom is relatively sensitive to the changing demands of the connected amplifier and an audible change in the character of the amplifier results.

Since the secondary windings 20, 22 may have different voltage and current ratings, winding 20 may have less voltage at quiescence than winding 22, and more loss of voltage (sag) as the current demands of the amplifier increase. The rate of sag, or how fast the voltage drops and recovers under operation, is directly related to the filtering of filter bank 40. The use of lower filtering with winding 20 makes the sag more noticeable, while the higher filtering used with winding 22 makes the supply "stiffer". As the B+ voltage in the amplifier lowers when using winding 20 the preamp voltage is also lowered. Thus, the use of switch S2D and resister 76 may be used to readjust the voltage as discussed herein.

By way of non-limiting example only, the VA rating for winding 22 may be 136, and the VA rating for winding 20 may be 83.75 or 38.4% less than winding 22. Thus, the second winding may have a VA rating at least 25% less than the first winding which may yield a noticeable change in performance. Further, by way of non-limiting example only, the connected audio power amplifier may use EL34 power tubes and the quiescent voltage for EL34's in punch mode may be 475 vdc. Under full load that voltage may drop (sag) to 438 vdc (37 volts). In sag mode the quiescent voltage may be 440 vdc and with a full load the voltage may drop (sag) to 376 (64 vdc). Thus, the quiescent voltage difference between punch and sag may be about 35 vdc and under full load the difference may be about 62 vdc. The use of a solid-state rectifier with winding 20 may give a quiescent voltage of 461 vdc, and that may sag to about 421 vdc under a full load.

A filament of the element 38 is heated by the secondary winding 18. DC voltage from rectifiers 34/36 is connected to element 38. B+ from the cathode of the thermionic element 38 is connected to the point A. Thermionic vacuum element 38 may be one of many known types such as a GZ34/5AR4, 5Y3, 5U4, etc. (all commonly used as diodes) and primarily serves to provide additional voltage sensitivity to the current flowing therethrough. Those of ordinary skill will appreciate that only one of rectifiers 34/36 or element 38 needs to be provided for the power supply to function in the sag mode. Nonetheless, it has been discovered that the internal resistance of element 38 provides desirable sonic characteristics and that the additional use of rectifiers provides an additional measure of safety to the connected audio amplifier against damage if element 38 fails.

A filter capacitor bank 40 reduces the ripple voltage from the rectified DC in a conventional manner and, thus, presents at point A a DC plate voltage adapted for use with vacuum thermionic elements of an audio amplifier. When switch S2B is opened, capacitor bank 40 presents a lower capacitance so that the voltage filtering provided thereby is relatively sensitive to such changing demands. Capacitor bank 40 may comprise a voltage divider formed of a pair of resisters 43 and 47 to which capacitors 42 and 46 are connected. As noted above, the switch S2B is coordinated with the switch S2A such that the capacitor 44 is electrically deactivated when the second secondary winding 20 is activated to prevent capacitor 44 from interfering with the use of element 38. In this way, the invention ensures that a relatively large capacitance can be used with winding 22, while ensuring that element 38 is not damaged by the presence of too much capacitance (preferably no greater than about 60 uF) and that the desired sensitivity provided by the use of winding 20 and element 38 is not compromised by the presence of too much capacitance. The total capacitance of bank 40 will depend on various known factors such as the number and type of power tubes used in the connected audio amplifier.

With continuing reference to FIG. 1, it will be seen that the voltage presented at point A may be further filtered in a conventional way by the use of an inductor L and capacitor 60 to present another DC voltage at point B. Further dropping resistors 70, 72 and 74 may apply voltage to power supply points C, D and E, to which other stages of an amplifier circuit (not shown) may be connected. Further decoupling and filtering is provided by capacitors 63, 64 and 66 in a conventional manner as shown.

In the case of an amplifier circuit using cathode bias throughout, the power supply circuit described above would be complete. Cathode bias in the power amplifier tubes provides the advantage of its natural tendency to compensate for B+ voltage changes which naturally occur from switching between the secondary coils 20 and 22 and their corresponding rectifying circuits.

However, a fixed bias supply 80 may be successfully used in such a power amplifier circuit even though the B+ operating voltage will differ significantly depending upon which secondary winding is connected. Such a bias supply preferably includes a current limiting resistor 82, a solid-state rectifying diode 83 whose cathode end is fed from a tap of the secondary coil 16, filtered by capacitor 84, fed through dropping resister 86 to a bias supply output point F where rectified DC is filtered by a capacitor 85. An adjustable voltage divider may also be provided via potentiometer 87 and resister 88 as shown in FIG. 1. Additionally, a single-pole single-throw switch S2C selectively permits engagement of the resister 89 as shown. It will be appreciated that the switch S2C is coordinated with the switch S2A (see FIG. 1a) such that the resister 89 is only electrically engaged when the second secondary winding 22 is activated. In this way, supply 80 automatically rebiases the tubes of the connected audio power amplifier for proper operation regardless of which secondary coil is selected.

Figure 2:
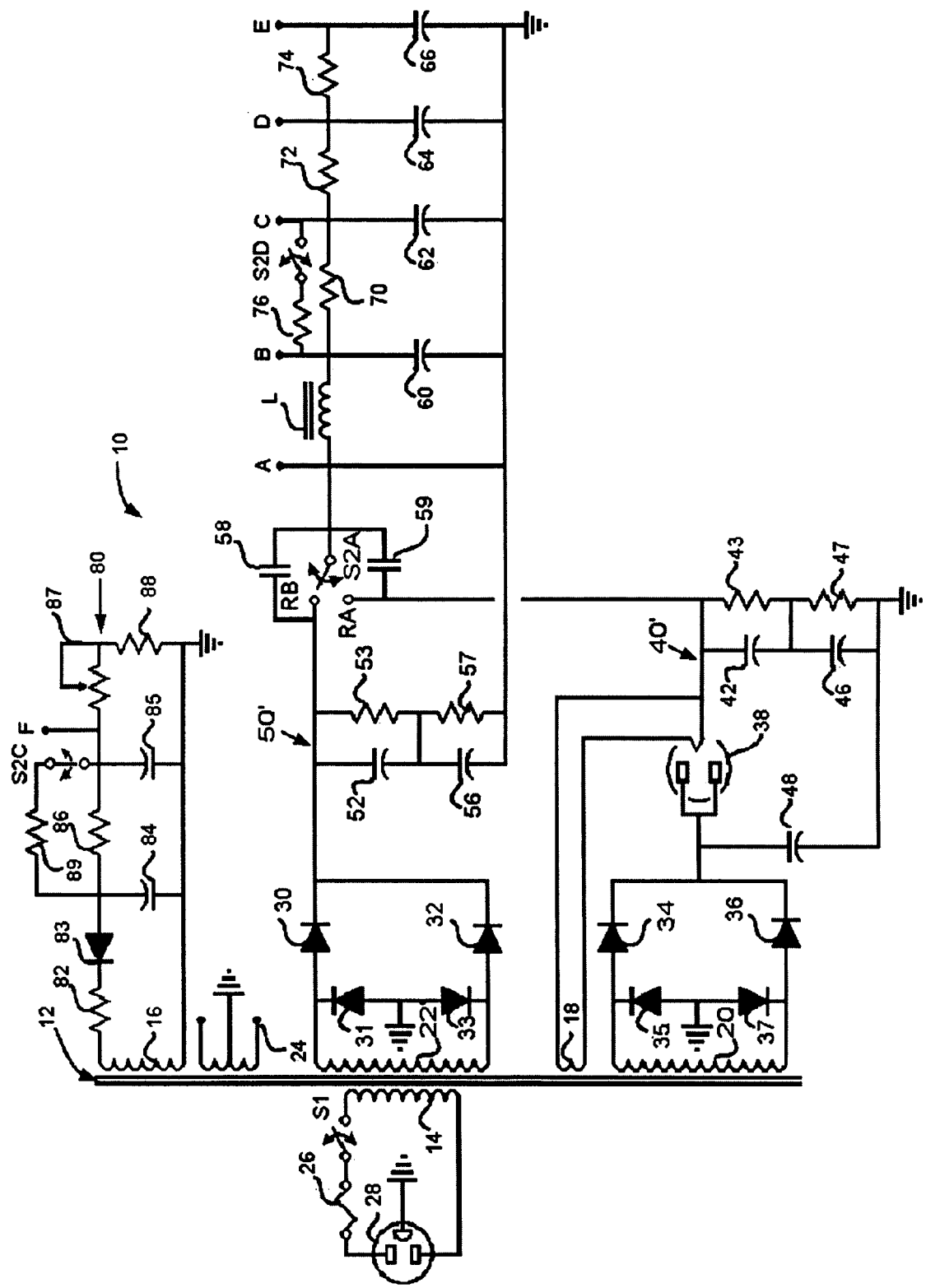
FIG. 2 illustrates a selectable power supply for use with a vacuum tube audio amplifier in accordance with another preferred embodiment of the present invention.

With joint reference now to FIGS. 2 and 2a, an amplifier power supply 10' according to another preferred embodiment of the present invention is shown which uses non-center tapped secondary windings. The power supply 10' is capable of operation in, preferably, two modes: (1) referred to herein as the "punch" mode which is characterized by a relative voltage insensitivity to different current-demand conditions dictated by the connected audio amplifier; and (2) referred to herein as the "sag" mode which is characterized by a relative voltage sensitivity to different current-demand conditions dictated by the connected audio amplifier. These modes are user-selected to achieve differing sonic effects and are changed by a number of coordinated switches. The states of these switches for the embodiment of FIG. 2 are summarized in FIG. 2a and discussed in detail below.

As shown in FIG. 2, the inventive power supply may include a conventional connection 28 for receiving AC power, connected through a conventional fuse 26 and a power on/off switch S1 coupled to a primary winding 14 of a power transformer 12. The power transformer 12' preferably includes a plurality of secondary windings, including a 6.3 volt heater winding 24, a first high voltage secondary 22' coil, a second high voltage secondary 20' coil, a power amplifier negative bias winding 16 and a five volt filament winding 18. As shown, the first and second secondary windings 22' and 20' may be directly connected to rectifiers 30/31/3233 and 34/35/ 36/37 respectively. The rectified DC voltage from 34/35/36/ 37 is then connected to element 38.

The preferred embodiment of FIG. 2 further includes an toggle switch S2A' that may be used to select either of windings 20' or 22' and their corresponding rectifiers by connecting with either point RA or point RB as shown. Further, capacitors 58 and/or 59 may also be connected as shown to reduce the tendency for the release a momentary "pop" or "surge" upon selection as is known in the art. It will also be appreciated, that switch S2A' may also have a third position in which it is not connected with either of RA or RB. If this third position (not shown) is provided, switch S2A' serves as both a winding selector and a power supply stand-by switch.

When the switch S1 is closed (thereby delivering power to the transformer 12) and the user selects the "punch" mode, switch S2A' is connected with terminal RB and, thus, high voltage rectified and filtered originating from the winding 22' is provided at output point A. High voltage winding 22', is specifically designed with a volt-amp rating that exceeds the expected demand of the connected audio amplifier so that the voltage provided therefrom is relatively insensitive to such changing demands. A filter capacitor bank 50' reduces the ripple voltage from the rectified DC in a conventional manner and, thus, presents at point A a DC plate voltage for use with vacuum thermionic elements of an audio amplifier. Similarly, capacitor bank 50' is specifically designed with a capacitance that exceeds the expected needs of the connected audio amplifier so that the voltage provided therefrom is relatively insensitive to the changing demands of the amp. As shown, capacitor bank 50' may comprise a voltage divider formed of a pair of resistors 53 and 57 to which capacitors 52 and 56 are connected. The voltage presented at point A may be further filtered in a conventional way by the use of an inductor L and capacitor 60 to present another bias voltage at point B. Further dropping resistors 70, 72 and 74 may apply voltage to power supply points C, D and E, to which other stages of an amplifier circuit (not shown) may be connected. Further decoupling and filtering is provided by the capacitors 63, 64 and 66 in a conventional manner as shown.

With continuing attention on FIG. 2, it is noted that a user may, alternatively, select the "sag" mode. In this alternative mode, high voltage AC from the winding 20' may be continually applied to solid state rectifiers 34/35/36/37. Additionally, capacitor 48 of relatively small capacitance may be used to reduce some of the ripple voltage from rectifiers 34/35/36/37. Rectified DC is, thus, applied to vacuum thermionic element 38. High voltage winding 20' is specifically designed with a lower volt-amp rating than that of winding 22'. In particular, the volt-amp rating of winding 20' is intentionally selected to cause a substantial voltage drop when the current demand of the connected audio amplifier increases substantially. In this way, the voltage provided therefrom is relatively sensitive to the changing demands of the connected amplifier and an audible change in the character of the amplifier results.

A filament of the element 38 is heated by the secondary winding 18. DC rectified voltage from elements 34/35/36/37 is connected to element 38. B+ from the cathode of the thermionic element 38 is connected to the point A. Thermionic vacuum element 38 may be one of many known types such as a GZ34/5AR4, 5Y3, 5U4, etc. (all commonly used as diodes) and primarily serves to provide additional voltage sensitivity to the current flowing therethrough. Those of ordinary skill will appreciate that only one of rectifiers 34/36 or element 38 needs to be provided for the power supply to function in the sag mode. In both cases rectifiers 35/37 will be needed to complete the bridge rectifier. Nonetheless, it has been discovered that the internal resistance of element 38 provides desirable sonic characteristics and that the additional use of rectifiers provides an additional measure of safety to the connected audio amplifier against damage if element 38 fails.

A filter capacitor bank 40' reduces the ripple voltage from the rectified DC in a conventional manner and, thus, presents at point RA a DC plate voltage adapted to vacuum thermionic elements of an audio amplifier. By contrast with bank 50', capacitor bank 40' is specifically designed with a lower capacitance so that the voltage filtering provided thereby is relatively sensitive to such changing demands. Capacitor bank 40' may comprise a voltage divider formed of a pair of resisters 43 and 47 to which capacitors 42 and 46 are connected. As shown, the switch S2A' may be connected such that the capacitor bank 50' is electrically decoupled from the connected audio amplifier when the second secondary winding 20' is selected. This prevents bank 50' from interfering with the use of element 38. In this way, the invention ensures that a relatively large bank 50' can be used with winding 22', while ensuring that element 38 is not damaged by the presence of too much capacitance and that the desired sensitivity provided by the use of winding 20' and element 38 is not compromised by the presence of too much capacitance. Similarly, bank 40 is decoupled from the connected audio amplifier when winding 22' is selected. The total capacitance of bank 40' will depend on various known factors such as the number and type of power tubes used in the connected audio amplifier.

With continuing reference to FIG. 2, it will be seen that the voltage presented at point A may be further filtered in a conventional way by the use of an inductor L and capacitor 60 to present another DC voltage at point B. Further dropping resistors 70, 72 and 74 may apply voltage to power supply points C, D and E, to which other stages of an amplifier circuit (not shown) may be connected. Further decoupling and filtering is provided by capacitors 63, 64 and 66 in a conventional manner as shown.

In the case of an amplifier circuit using cathode bias throughout, the power supply circuit described above would be complete. Cathode bias in the power amplifier tubes provides the advantage of its natural tendency to compensate for B+ voltage changes which naturally occur from switching between the secondary coils 20 and 22 and their corresponding rectifying circuits.

However, a fixed bias supply 80 may be successfully used in such a power amplifier circuit even though the B+ operating voltage will differ significantly depending upon which secondary coil and/or rectifier circuit is selected. Such a bias supply preferably includes a current limiting resistor 82, a solid-state rectifying diode 83 whose cathode end is fed from a tap of the secondary coil 16, filtered by capacitor 84, fed through dropping resister 86 to a bias supply output point F where rectified DC is filtered by a capacitor 85. An adjustable voltage divider may also be provided via potentiometer 87 and resister 88 as shown in FIG. 2. Additionally, a single-pole single-throw switch S2C selectively permits engagement of the resister 89 as shown. It will be appreciated that the switch S2C is coordinated with the switch S2A (see FIG. 2*a*) such that the resister 89 is only electrically engaged when the second secondary winding 22 is activated. In this way, supply 80 automatically rebiases the tubes of the connected audio power amplifier for proper operation regardless of which secondary coil is selected.

In the preferred embodiments described herein switch S1 is preferably a single-pole/single-throw mechanical switch, but may be any one of the many well-known equivalents. Further, switch S1 may also be a single-pole/double-throw switch to allow it to be used as a power supply standby switch. Further, the preferred embodiments described herein may use one quadruple-pole/single-throw switch to mechanically serve as switches S2A, S2B, S2C and S2D. Those of skill in the art will know how to use other mechanical switches to effectuate all or fewer than all of the above-noted features in one or more similar mechanical switches. Further, some or all of the switching functions noted above may be executed with some combination of mechanical, solid state, optical, electrical, MIDI or other switches such as opto-couplers, LDR's, and relays. Moreover, many of the well known stand-by switches (such as double-pole/double-throw switches between the transformer secondary windings and the rectifier elements) may be used in combination with the invention. Finally, it will be appreciated that both secondary windings, their respective rectifiers and their respective capacitor banks may be operated simultaneously with the use of a logical AND switch and various component value changes.

As discussed throughout, the solid-state diodes may be made of silicon, germanium or any of the other known materials as desired. Further, those of ordinary skill will know how to apply the principles of the invention described herein with various rectification circuits such as either half-wave rectifiers and full-wave rectifiers.

While the present invention has been described in connection with what is presently considered to be the most practical and preferred embodiments, it is to be understood that the invention is not limited to the disclosed embodiments, but is intended to encompass the various modifications and equivalent arrangements included within the spirit and scope of the appended claims. With respect to the above description, for example, it is to be realized that the optimum dimensional relationships for the parts of the invention, including variations in size, materials, shape, form, function and manner of operation, assembly and use, are deemed readily apparent to one skilled in the art, and all equivalent relationships to those illustrated in the drawings and described in the specification are intended to be encompassed by the appended claims. Therefore, the foregoing is considered to be an illustrative, not exhaustive, description of the principles of the present invention.

What is claimed is:

1. A selectable power supply for use in a thermionic vacuum tube audio amplifier comprising:
   a power transformer having a first secondary coil for providing a first AC power voltage with a first volt-amp rating and a second secondary coil for providing a second AC power voltage with a second volt-amp rating that is different from the first volt-amp rating;
   first rectifying means coupled to the first secondary coil for converting the power to a first rectified DC plate voltage,
   second rectifying means coupled to the second secondary coil for converting the power to a second rectified DC plate voltage,
   filter means coupled to the first and second rectifying means for reducing the ripple component of one of the first or second rectified DC plate voltage to thereby present DC plate voltage adapted to supply at least one vacuum thermionic element of an audio amplifier; and
   user-selectable switch means for selectively interrupting the rectified DC plate voltage presented at the filter means.

2. The power supply of claim 1 further comprising a thermionic vacuum element coupled in series with the second rectifying means, and wherein:
   the first and second rectifying means comprise solid state rectifiers; and
   the filter means comprises an RC filter having a total capacitance of less than 60 μF.

3. The power supply of claim 1 wherein:
   the first rectifying means comprises a solid state rectifier;
   the second rectifying means comprises a thermionic vacuum element; and
   the filter means comprises an RC filter having a total capacitance no greater than about 60 μF.

4. The power supply of claim 1 wherein:
   the first secondary coil is a center tapped coil;
   the second secondary coil is a center tapped coil; and
   the user-selectable switch means comprises a switch for coupling one of the center tap of the first secondary coil or the center tap of the second secondary coil to ground.

5. The power supply of claim 4 wherein the user-selectable switch means further comprises a switch that changes the capacity of the filter means in response to coupling of one of the center tap of the first secondary coil or the center tap of the second secondary coil to ground.

6. The power supply of claim 1 wherein the second secondary coil has a volt-amp rating at least 25 percent lower than the volt-amp rating of the first secondary coil.

7. The power supply of claim 1 wherein the switch means further comprises means for engaging a second filter means in response to user selection of the second secondary coil.

8. The power supply of claim 1 wherein the power supply further comprises a filter network with multiple output points with unique plate voltage levels and wherein the switch means Her comprises means for changing the plate voltage level at least one of the output points in response changing user selection from one of a punch mode to a sag mode.

9. The power supply of claim 1 wherein the filter means further comprises multiple output points and wherein the switch means reduces the DC plate voltage level at least one of the output points in response changing user selection from a punch mode to a sag mode.

10. A selectable power supply for use in an audio amplifier comprising:
    a power transformer having a first secondary coil for providing a first AC power voltage with a first volt-amp rating and a second secondary coil for providing a second AC power voltage with a second volt-amp rating that is different from the first volt-amp rating;
    first rectifying means coupled to the first secondary coil for converting the first AC power voltage to a first rectified DC plate voltage;
    first capacitive filter coupled to the first rectifying means for reducing the ripple component of the first rectified DC plate voltage;
    second rectifying means coupled to the second secondary coil for converting the second AC power voltage to a second rectified DC plate voltage;
    second capacitive filter coupled to the second rectifying means for reducing the ripple component of the second rectified DC plate voltage;
    a switch for selectively coupling either to the first capacitive filter or to the second capacitive filter; and
    a voltage divider coupled to the switch to thereby convert the rectified DC plate voltage of the selectively coupled capacitive filter into plural DC plate voltages adapted to bias active electronic elements of the audio amplifier.

11. The power supply of claim 10 wherein the AC power voltage of the first and second secondary coils sags in response to a current demand greater than the volt-amp rating of the secondary coils, and wherein the first secondary coil sags less than the second coil.

12. The power supply of claim 10 wherein
the first rectifying means comprises a solid state rectifier;
the first capacitive filter comprises an RC filter having a first total capacitance;
    the second rectifying means comprises a thermionic vacuum element; and
the second capacitive filter comprises an RC filter having a second total capacitance, the second total capacitance being at least 20 percent less than the first total capacitance and no greater than 60 μF.

13. A method of providing plate voltages for use in a vacuum thermionic audio amplifier comprising:
    providing a first AC power voltage;
    providing a second AC power voltage that is different from the first AC power voltage;
    selecting one of the first or second AC power voltages;
    rectifying the selected AC power voltage to thereby produce a rectified DC plate voltage;
    selecting one of a first or a second filter and coupling the selected filter to the rectified DC plate voltage to thereby reduce the ripple voltage of the rectified DC plate voltage;
    dividing the filtered rectified DC plate voltage into plural voltages adapted to supply at least one vacuum thermionic element of the audio amplifier; and
    providing the plural voltages at multiple outputs.

14. The method of claim 13 further comprising changing the voltage at least one of the multiple outputs responsive to changing user selection from one of the AC power voltages to the other of the AC power voltages.

15. The method of claim 13 further comprising reducing the voltage at least one of the multiple outputs in response to changing user selection from one of the AC power voltages to the other of the AC power voltages.

16. The method of claim 13 wherein the second AC power voltage sags at least 25% more than the first AC power voltage in response to current demand increasing from a quiescent level to a full load wherein rectifying further comprises rectifying with a solid-state rectifier, and wherein selecting an AC power voltage comprises selecting the first AC power voltage.

17. The method of claim 13 wherein the second AC power voltage sags at least 25% more than the first AC power voltage in response to current demand increasing from a quiescent level to a full load, wherein rectifying further comprises rectifying with a vacuum thermionic rectifier, and wherein selecting an AC power voltage comprises selecting the second AC power voltage.

* * * * *